United States Patent
Gao

(10) Patent No.: US 11,737,233 B2
(45) Date of Patent: Aug. 22, 2023

(54) CODESIGN OF SERVER RACK POWER DELIVERY SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 64 days.

(21) Appl. No.: 17/407,913

(22) Filed: Aug. 20, 2021

(65) Prior Publication Data

US 2023/0057545 A1 Feb. 23, 2023

(51) Int. Cl.
*H05K 7/14* (2006.01)
*H05K 7/20* (2006.01)

(52) U.S. Cl.
CPC ....... *H05K 7/1492* (2013.01); *H05K 7/20781* (2013.01)

(58) Field of Classification Search
CPC ............ H05K 7/1492; H05K 7/20781; H05K 7/14329; H05K 7/1472; H05K 7/1477; H05K 7/1578; H05K 7/20818
See application file for complete search history.

(56) References Cited

U.S. PATENT DOCUMENTS

| | | | |
|---|---|---|---|
| 11,096,314 B2 * | 8/2021 | Gupta | H05K 7/16 |
| 11,528,825 B2 * | 12/2022 | Kuo | H05K 7/1492 |
| 2019/0206379 A1 * | 7/2019 | Peterson | H05K 7/20727 |

* cited by examiner

*Primary Examiner* — Anthony Q Edwards
*Assistant Examiner* — Hung Q Dang
(74) *Attorney, Agent, or Firm* — Womble Bond Dickinson (US) LLP

(57) ABSTRACT

Methods, systems, and devices for distributing power in a computing environment such as a rack in data center are disclosed. The disclosed methods and systems may provide for a high degree of power distribution reliability in a liquid cooling rack. To provide for power distribution reliability, the power distribution components such as busbars and power clips may be segregated from other components such as cooling fluid distribution components. By segregating these components from one other, the magnitude of damage or impact such as short circuits due to leaked cooling fluid may be eliminated and prevented to a large extend.

20 Claims, 15 Drawing Sheets

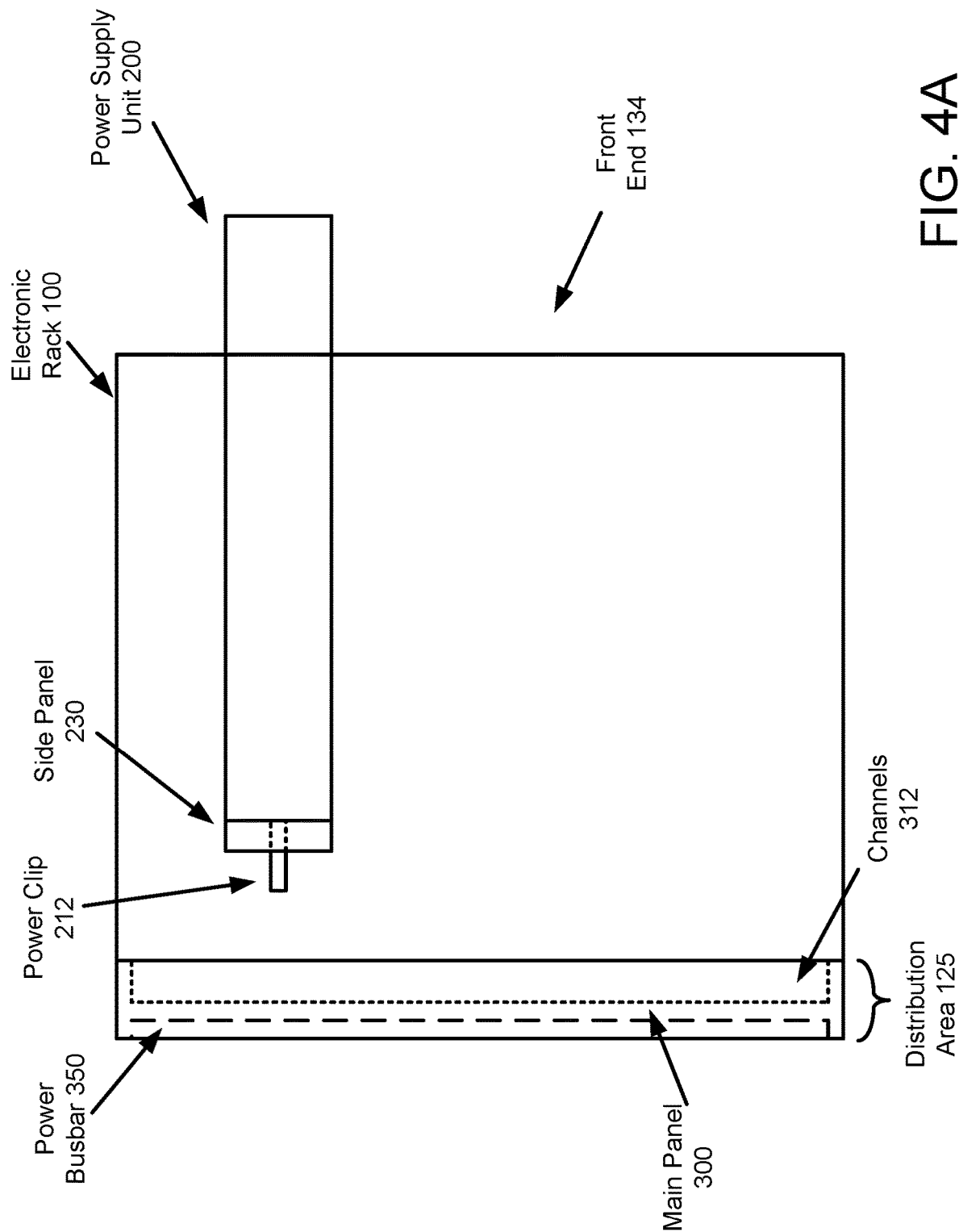

CODESIGN OF SERVER RACK POWER DELIVERY SYSTEM

FIELD OF THE INVENTION

Embodiments of the present invention relate generally to power distribution in servers. More particularly, embodiments of the invention relate to power and cooling segregation for servers.

BACKGROUND

Cooling is a prominent factor in a computer system and data center design. The number of high performance electronics components and devices such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime.

In addition to cooling, power distribution in data center design is another prominent factor. Due to the segregation of different functions in a data center environment, multiple server chassis may be powered using a separate power supply unit, or rack based centralized power supply unit. Both power and cooling function may be needed to allow computer systems and data centers to function.

BRIEF DESCRIPTION OF THE DRAWINGS

Embodiments of the invention are illustrated by way of example and not limitation in the figures of the accompanying drawings in which like references indicate similar elements.

FIG. 4A shows a first side view diagram of an electronic rack and power supply unit according to one embodiment.

DETAILED DESCRIPTION

Figure 1:
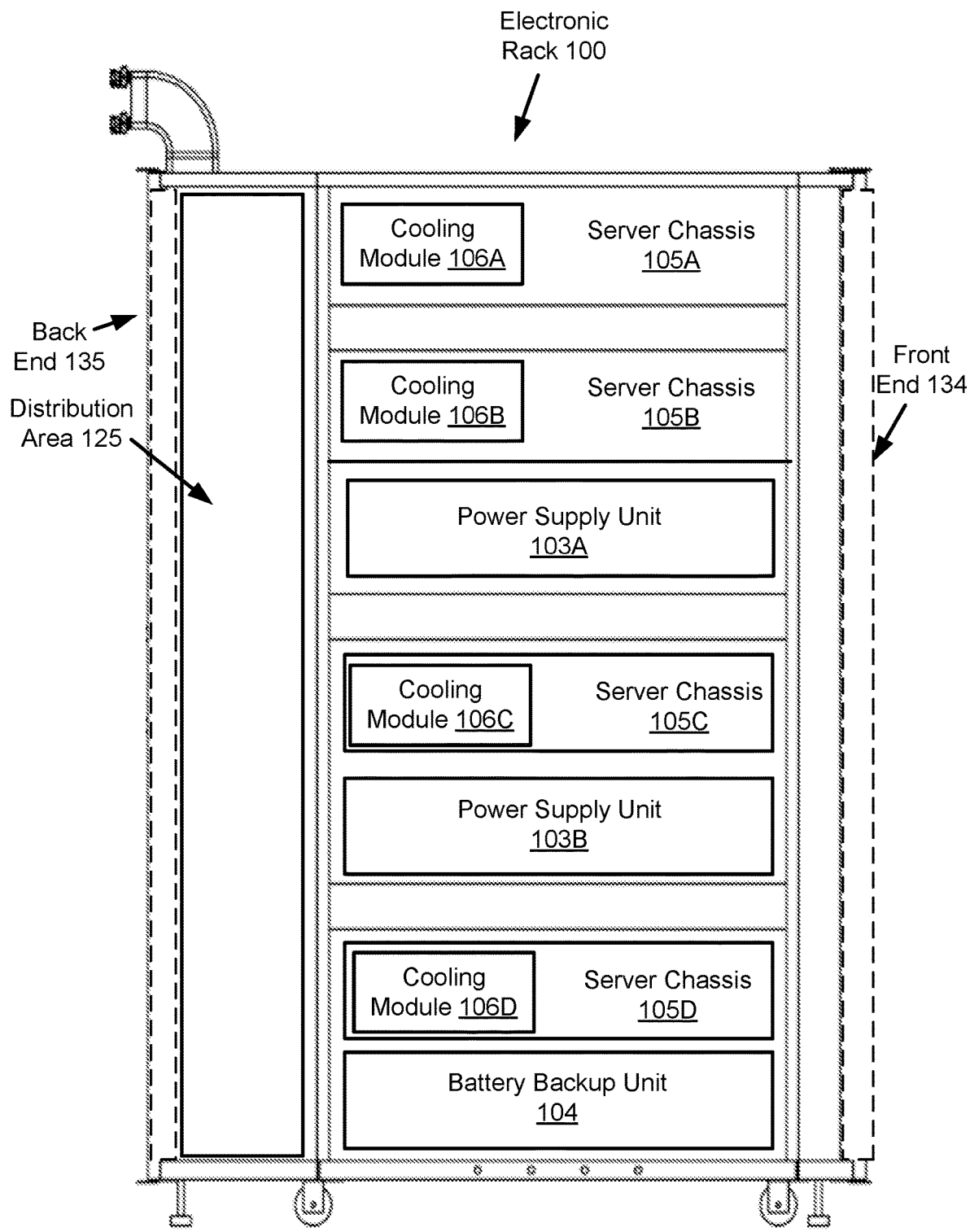
FIG. 1 shows a diagram of an electronic rack according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for distributing power in a computing environment such as a data center. The disclosed methods and systems may provide for a high degree of power distribution reliability. To provide for power distribution reliability, the power distribution components such as busbars and power clips may be segregated from other components such as cooling fluid distribution components. By segregating these components from one other, the operation of the cooling fluid distribution components may be less likely to disrupt the operation of the power distribution components. Segregation of the fluid system and the power system may improve the reliability of these system because leaked cooling fluid may cause catastrophic impacts.

For example, consider a scenario where a fluid distribution component that distributes a cooling fluid used to cool server chassis or other components is positioned with a busbar used to distribute power to the server chassis. If a leak forms that allows cooling fluid to reach the busbar, then the cooling fluid may short out the busbar, modify the electrical characteristics of the busbar, or otherwise impact the operation of the busbar. In some of the cases, the leaked fluid may cause more series impact besides impacting the power system. Embodiments of the invention may proactively address such a scenario by segregating these components from each other such that if cooling fluid leaks do occur, then the leaked cooling fluid is less likely to impact the busbar.

Additionally, embodiments disclosed herein may provide for prevention and detection of cooling fluids escaped from cooling fluid distribution components. To detect such leaks, detection modules may be positioned by the components segregated from the cooling fluid distribution components. In this scenario, when a cooling fluid leak occurs, the detection modules may detect the presence of the cooling fluid and report it to an electronic rack manager (or other type of management component). The electronic rack manager may automatically take action in response to such reports. For example, the rack manager may notify administrators, modify power distribution which components that may be impacted by the leaked cooling fluid, and/or take action to reduce or remediate leaking (e.g., terminate/reduce cooling fluid flow, shut down impacted server chassis, etc.).

In one embodiment, an electronic rack includes a power supply unit positioned in the electronic rack, the power supply unit includes a first power clip positioned on a rear of the power supply unit to distribute direct current to a server chassis positioned in the electronic rack. The electronic rack may also include side panels positioned on the rear of the power supply unit to surround the first power clip on two of its sides. The electronic rack may also include a main panel positioned with respect to the side panels to form a first containment in which the first power clip is positioned while the power supply unit is positioned in the electronic rack. The first containment may segregate the first power clip from a fluid system positioned in the electronic rack, and the main panel may include channels positioned to receive the side panels while the power supply unit is positioned in the electronic rack. The electronic rack may also include a power busbar positioned with the first power clip to distribute the direct current to the server chassis.

The electronic rack may also include a detection module positioned with the main panel to detect a cooling fluid from the fluid system.

The main panel of the electronic rack may also include side portions on which the channels are positioned. The main panel may also include a rear portion connecting the side portions. Each of the side panels may be adapted to be inserted into the channels, the side panels and two side portions forming a continuous panel extending from the rear of the power supply unit to a back wall of the electronic rack while the power supply unit is positioned in the electronic rack. The rear portion may include perforations whereas the side portions may include solid portions to form the continuous panel.

The power supply unit may also include a second power clip, the main panel forms a second containment while the power supply unit is positioned in the electronic rack, and the second containment segregates the second power clip from the fluid system positioned in the electronic rack and the first power clip.

The power supply unit also includes a second power clip, the first containment segregates the second power clip from the fluid system positioned in the electronic rack.

The electronic rack may also include a battery backup unit. The battery backup unit may include a third power clip positioned to connect to the power busbar while the battery backup unit is positioned in the electronic rack. A portion of the side panels may be positioned on a rear of the battery backup unit to surround the third power clip on two of its sides. A portion of the channels may be positioned to receive the portion of the side panels while the battery backup unit is positioned in the electronic rack. The first containment segregates the third power clip from the fluid system positioned in the electronic rack.

In some embodiments, a portion of the side panels are positioned on a rear of the server chassis to surround a third power clip on the server chassis while the server chassis is positioned in the electronic rack. In this manner, multiple segregation regions may be formed to correspond to the power busbars and/or power clips.

In one embodiment, the main panel is adapted to be populated in the electronic rack after the power supply unit is populated in the electronic rack. For example, the main panel may be formed as a unit with a power busbar or may be formed as a kit with the power busbar for separate installation.

In one embodiment, the main panel is adapted to be populated in the electronic rack before the power supply unit is populated in the electronic rack. For example, the main panel may be present in the electronic rack before server chassis and/or other components are inserted into the electronic rack.

The main panel may include a power cable for distributing alternating current to the power supply unit.

By implementing a system as discussed above, a hardware design for electronic rack power delivery may be provided. The design may provide an improve electronic rack architecture design efficiency and reliability. In an embodiment, the hardware design provides for the use of cooling fluid distribution along with power distribution in a manner that facilitates these separate functionalities. Embodiments here may provide a widely applicable approach for power and cooling fluid distribution function with power supply units, battery backup units, and server chassis. The disclosed embodiments may be widely applicable to a range of different electronic rack architectures, and may allow different server chassis configurations to be used in the electronic racks. Additionally, the embodiments disclosed herein may provide for ease of deployment and service, as well as backwards compatibility with existing electronic racks. For example, the embodiments may provide for integration via retrofit or installation with existing electronic rack that are already populated.

FIG. 1 is block diagram illustrating an electronic rack according to one embodiment. Electronic rack 100 may represent any of the electronic racks as described throughout this application. According to one embodiment, electronic rack 100 includes, but is not limited to, one or more power supply units 103A-103B, battery backup unit 104, and one or more server chassis 105A-105D (collectively referred to as server chassis 105).

Server chassis 105 may be inserted into an array of server slots (e.g., standard shelves) respectively from front end 134 or back end 135 of electronic rack 100. Although there are four server chassis 105A-105D shown here, additional or fewer server chassis 105 may be maintained within electronic rack 100. Also note that the particular positions of power supply units 103A-103B, battery backup unit 104, and/or server chassis 105 are shown for purposes of illustration only; other arrangements or configurations of these components may also be implemented. In one embodiment, electronic rack 100 can be either open to the environment or partially contained by a rack container.

Each of server chassis 105 may include one or more IT components (e.g., central processing units or CPUs, general/graphic processing units (GPUs), memory, and/or storage devices). Each IT component may perform data processing tasks. One or more of the IT components may execute software stored in a storage device or other persistent storage medium. The software may be loaded into the memory, and executed by one or more processors (e.g., IT components) to perform the data processing tasks.

Server chassis 105 may include a host server (referred to as a host node) coupled to one or more compute servers (also referred to as computing nodes, such as CPU server and GPU server, any of which may be implemented with the server chassis 105). The host server (having one or more CPUs) may interface with clients over a network (e.g., Internet) to receive a request for a particular service such as storage services (e.g., cloud-based storage services such as backup and/or restoration), processing services, or any other type of services.

In response to the request, the host server may execute an application to perform certain operations (e.g., image processing, deep data learning algorithms or modeling, etc., as, for example, a part of a software-as-a-service (SaaS) platform). In response to the request, the host server distributes the tasks to one or more of the computing nodes or compute servers (e.g., having one or more CPUs, GPUs, other types of special purposes hardware devices, etc.) managed by the host server. The compute servers and/or host server may perform the tasks, which may consume electrical power and generate heat during the operations carried out to perform the tasks.

To manage the heat generated during operation, any of server chassis 105 may include any number of cooling modules 106A-106D (collectively, cooling modules 106). The cooling modules 106 may cool corresponding IT components. In one embodiment, the cooling modules 106 are fluid cooling devices. The cooling modules 106 may receive a cooling fluid and transfer heat generated by the IT components into the cooling fluid thereby cooling the IT components. The cooling fluid may be circulated through the cooling modules 106 thereby removing heat from server chassis 105. The cooling fluid may be circulated to other systems (not shown) to discharge the removed heat from the cooling fluid thereby allowing the cooling fluid to be circulated back to the cooling modules 106 for heat removal.

To provide power to server chassis 105 and manage heat generated by the devices (IT components and/or other devices) in the server chassis 105, electronic rack 100 may include distribution area 125. Components usable to (i) distribute power to various components positioned in electronic rack 100 and (ii) remove heat from various components positioned in electronic rack 100 may both be positioned in distribution area 125. In an embodiment, the components that provide these respective functions are segregated from one another in distribution area 125. Segregating these components from one another may reduce the likelihood of these components from impacting the operations of the respective components.

For example, consider a scenario where power distribution components and cooling fluid distribution components are both positioned in distribution area 125, but are not segregated from each other. If cooling fluid escapes from the cooling fluid distribution components, then the cooling fluid may disrupt the function of the power distribution components. However, if these components are segregated from one another, then even cooling fluid that escapes from the cooling fluid distribution components (e.g., due to leaks or other issues) may be unlikely to disrupt the operation of the power distribution components by virtue of the segregation between these components. The segregation can be also understood as that the fluid system including the cooling module, rack fluid system (not shown in FIG. 1) are fully contained, or the other components, or systems such as power delivery system are fully contained.

Power supply units 103A-103B (collectively, power supply units 103) may receive power from an external supply (such as a power grid), convert it to a type of power that is compatible with other components in electronic rack 100 such as server chassis 105 and battery backup unit 104, and distribute the converted power to other components such as server chassis 105. For example, power supply units 103 may receive alternating current from an external supply, convert the alternating current to direct current, and distribute the direct current to the server chassis 105 and/or battery backup unit 104 with power distribution components (e.g., one or more busbars) positioned in distribution area 125.

Like power supply units 103, battery backup unit 104 may also distribute power to other components in electronic rack 100. However, battery backup unit 104 may do so selectively while power from other sources (e.g., a grid) is not available. For example, when power is available from other sources, battery backup unit 104 may charge batteries (or other power storage devices) with power from the power supply units 103 and/or directly from the utility or other sources. When power from the other sources is unavailable, battery backup unit 104 may discharge power from the power storage devices and provide the extracted power to the other components (e.g., server chassis 105). Battery backup unit 104 may also be used for other purposes (e.g., load balancing/smoothing/etc.). To obtain and distribute power, battery backup unit 104 may utilize the same (or different) power distribution components positioned in distribution area 125 utilized by the power supply units 103.

Figure 2A:
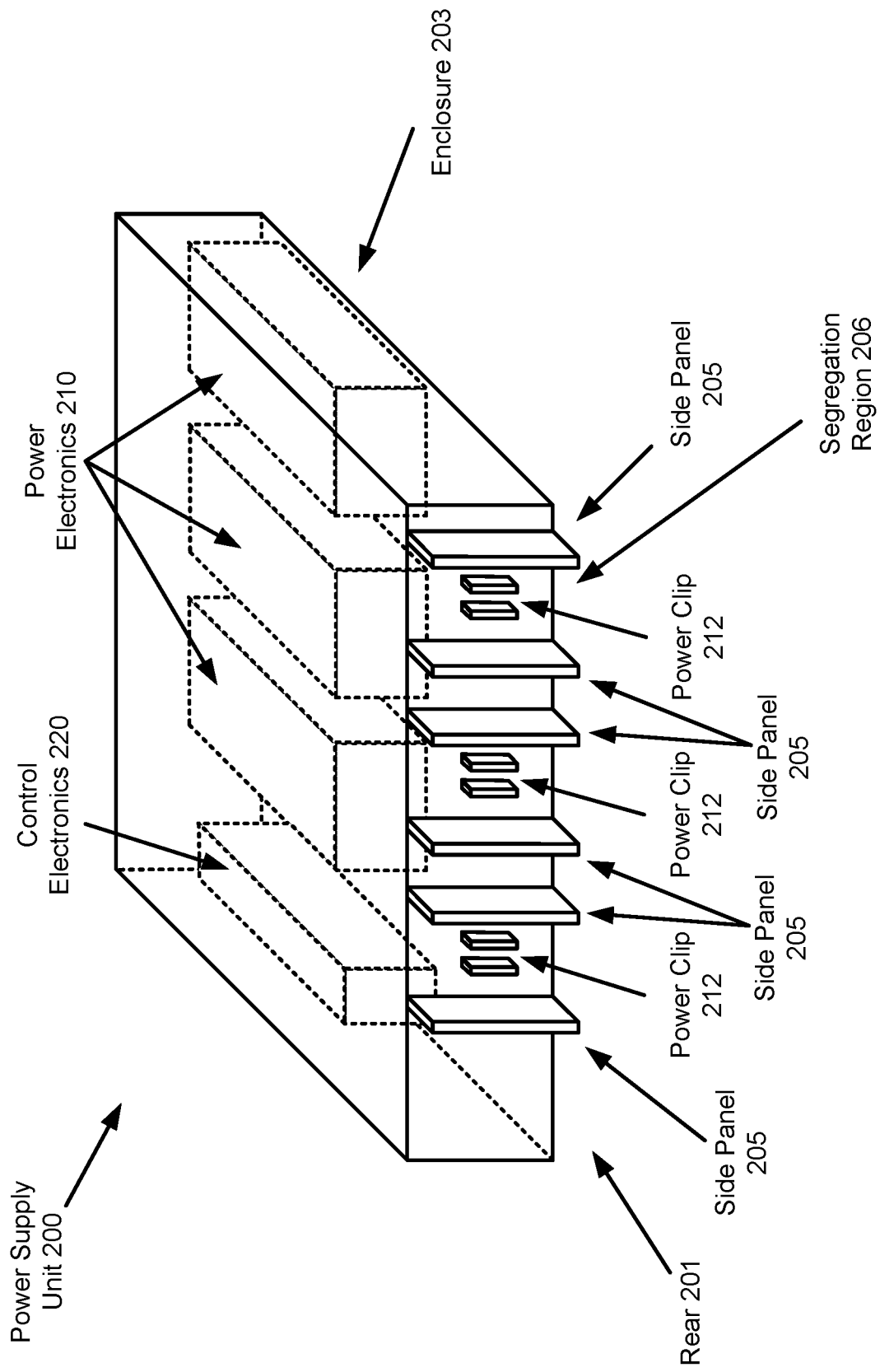
FIG. 2A shows a first diagram of a power supply unit according to one embodiment.

Turning to FIG. 2A a diagram of an example power supply unit 200 in accordance with one or more embodiments is shown. The example power supply unit 200 may be similar to the power supply units discussed with respect to FIG. 1. In this figure, components that would otherwise be obscured by enclosure 203 are drawn with dashed outlines.

Power supply unit 200 may obtain power from a power source, condition the power, and provide the conditioned power to other devices such as server chassis, battery backup units, and/or other devices. For example, power supply unit 200 may obtain alternating current from a source such as a power grid, rectify it into direct current, and provide the direct current to other devices via a bus or other distribution method. The other devices may be incapable of operating using the alternating current. To provide its functionality, power supply unit 200 may include enclosure 203, one or more side panels 205, power electronics 210, one or more power clips 212, and control electronics 220. Each of these components is discussed below.

Enclosure 203 may be a physical device having a shape and size corresponding to a standard or other pre-agreed upon structure for devices that to be positioned in an electronic rack. For example, enclosure 203 may be a rectangular structure with openings and/or other structures that facilitate integration of power supply unit 200 with electronic racks (or other types of structures for arranging components of a computing environment). Enclosure 203 may include rails (not shown) or other structures to position power supply unit 200 in an electronic rack.

Power electronics 210 and control electronics 220 may be positioned in enclosure 203. These components may be usable for conditioning power received from another sources. For example, power electronics 210 may include transformers, semiconductor devices, and/or other types of components (e.g., to form a rectifier) for converting alternating current into direct current at voltage and current levels usable by other components (e.g., server chassis, battery backup units, and/or other devices that may not be capable of using alternating current or direct current having unusable voltage/current levels, etc.). The power electronics 210 and control electronics 220 may perform the function of a power supply for one or more other devices (e.g., server chassis, battery backup units, etc.).

To distribute the conditioned power from power electronics 210 and control electronics 220, power supply unit 200 may include one or more power clips 212. The power clips 212 may include conductive components usable to operably connect (for power distribution purposes) the power electronics 210 to structures positioned in distribution area 125 shown in FIG. 1. Power clips 212 may be internally connected (i.e., inside enclosure 203) to power electronics 210.

For example, power clips 212 may be implemented with a pair of conductive elements sized, positioned, and/or oriented with enclosure 203 so that the pair of conductive elements physically contacts a busbar positioned in distribution area 125 while power supply unit 200 is positioned inside of electronic rack 100 (e.g., when power supply unit 200 is inserted into the interior of electronic rack 100). In one embodiment, power clips 212 are positioned on a rear 201 of power supply unit 200. The rear 201 may be positioned proximate to distribution area 125 while power supply unit 200 is positioned in electronic rack 100. The power clips 212 may be positioned on rear 201 in positions complimentary to where busbars or other types of power distribution components are placed in distribution area 125 of an electronic rack. In other embodiments, the power clips 212 area positioned to correspond to power clips on other components such as server chassis 105. In such embodiments, the power distribution components in distribution area 125 may be moved or adjusted to facilitate connection to the power clips 212 and power clips of other power distribution components. As will be discussed in great detail below, in some embodiments, the power distribution components may be installed in (or retrofitted to) an electronic rack 100 after server chassis, power supply units, battery backup units, and/or other components are positioned in the electronic rack.

The power supply unit 200 may include any number of power clips (e.g., 1, 2, many) without departing from embodiments disclosed herein. The number of power clips, the type of power clips (e.g., which may define a number of conductors, conductor shapes, conductor positioning, etc.), and other features of the power clips 212 may be based on a power need (e.g., power level, redundancy design, etc.) of a deployment (which may include any number of devices in an electronic rack).

To provide for segregation of the power clips 212 from other components, any number of side panels 205 may be positioned with enclosure 203. The side panels 205 may provide for physical segregation of power clips 212 and components to which power clips 212 are attached from other components positioned in distribution area 125 of FIG. 1. For example, side panels 205 may segregate power clips 212 and other components from cooling fluid distribution components to reduce the likelihood of escaped cooling fluid from coming into contact with power clips 212.

Side panels 205 may be positioned on rear 201 and with respect to the power clips 212 to define segregation regions (e.g., 206). The side panels 205 may be positioned with respect to other components that are positioned in distribution area 125 to allow the side panels 205 to connect, interface, or otherwise interact with other components to segregate the power clips 212 and other power distribution components from other types of components in distribution area 125, such as cooling fluid distribution components, while power supply unit 200 is positioned in an electronic rack. Refer to FIGS. 3A-4H for additional information regarding positioning of side panels 205 with respect to other components for segregation purposes.

Side panels 205 may, for example, have rectangular shapes with a first side of the rectangular shapes being positioned on the rear 201 of enclosure 203. Pairs of side panels 205 may be positioned along a width (left to right in FIG. 2A) of rear 201 to define segregation regions 206 in which power clips 212 may be positioned. For example, in FIG. 2A three pairs of side panels are shown that define three segregation regions in which a corresponding power clip is positioned. Different numbers of power clips may be positioned in each segregation region. Different segregation regions may have different sizes, shapes, and/or other features. Other types of components may also be positioned in the segregation regions. The separation of multiple side panels, such as a separate set of side panel for each of the power clip considers more flexible solution. For example, the rack fluid distribution may be located between the two power clips in one configuration.

The rectangular shapes may extend outward from rear 201 to form walls that partially enclose power clips 212 and/or other components positioned in segregation regions. The walls may be formed with other components positioned in distribution area 125 to more completely segregate the power clips 212 and other components.

The side panels may have a height (top to bottom of the page in FIG. 2A) similar to that of the enclosure 203, as illustrated in FIG. 2A. The side panels may have heights that are fractions of the height of enclosure 203 and/or larger than the height of enclosure 203 without departing from embodiments disclosed herein. Having a larger height may be helpful in some scenarios where the power supply unit is not stacked directly above and below other devices in an electronic rack resulting in some void space above and/or below power supply unit 200 being present in an electronic rack. The additional height in these scenarios may be usable to provide for segregation of space above and/or below the power clips. In one embodiment, the implementation of the side panel may be codesigned with the panel and the power supply unit chassis, for a more efficient product solution.

To facilitate segregation of power clips 212 from other components, a portion of each side panel that extends away from rear 201 may have a shape that facilitates insertion (or other types of interfacing) of side panels 205 into other structures (e.g., such as a channel). In other embodiments, side panels 205 may include recesses, slots, channels, and/or other types if features usable to receive or otherwise interface with other structures (e.g., such as side portions discussed with respect to later figures). Refer to FIGS. 3A, 3B, 4D, and 4E for additional details regarding insertion of side panels 205 into other components.

In one embodiment, the side panels 205 are separate from the enclosure 203 and may be attached to the enclosure 203. For example, the side panels 205 may be used to retrofit existing enclosures of power supply units through attachment to existing enclosures. The side panels 205 may be attachable to enclosure 203 using any method without departing from embodiments disclosed herein.

While power supply unit 200 in FIG. 2A is illustrated as including six side panels 205, a power supply unit in accordance with embodiments disclosed herein may include different numbers of side panels.

Figure 2B:
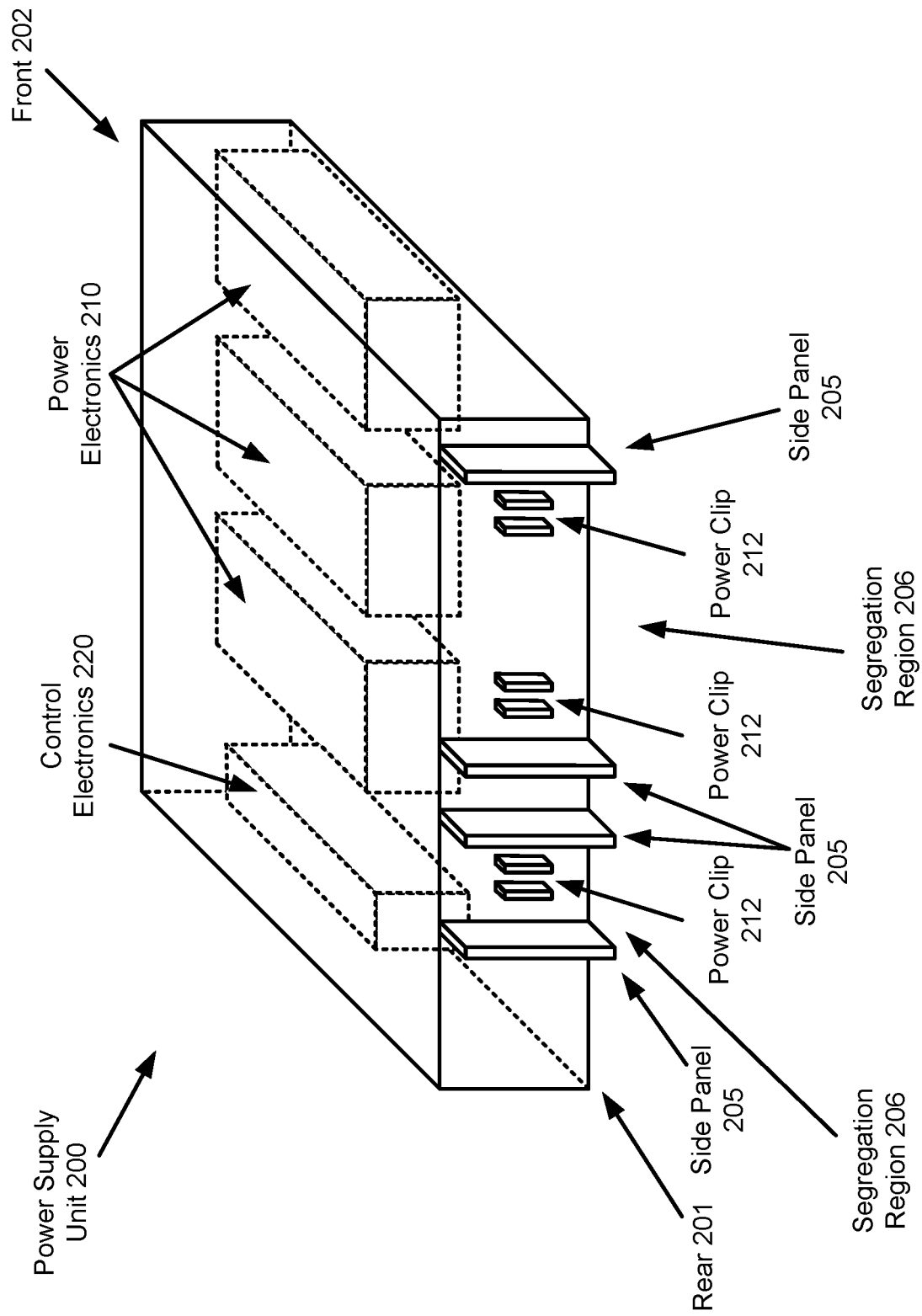
FIG. 2B shows a second diagram of a power supply unit according to one embodiment.

For example, turning to FIG. 2B, a diagram of example power supply unit 200 is shown with a different configuration of side panels 205 in accordance with one or more embodiments is shown. In the configuration shown in FIG. 2B, four side panels 205 are shown that define two segregation regions 206. A single power clips is positioned in one segregation region while two power clips are positioned in the other segregation regions. The different segregation regions have different sizes (e.g., one with a smaller width and one having a larger width).

Figure 2C:
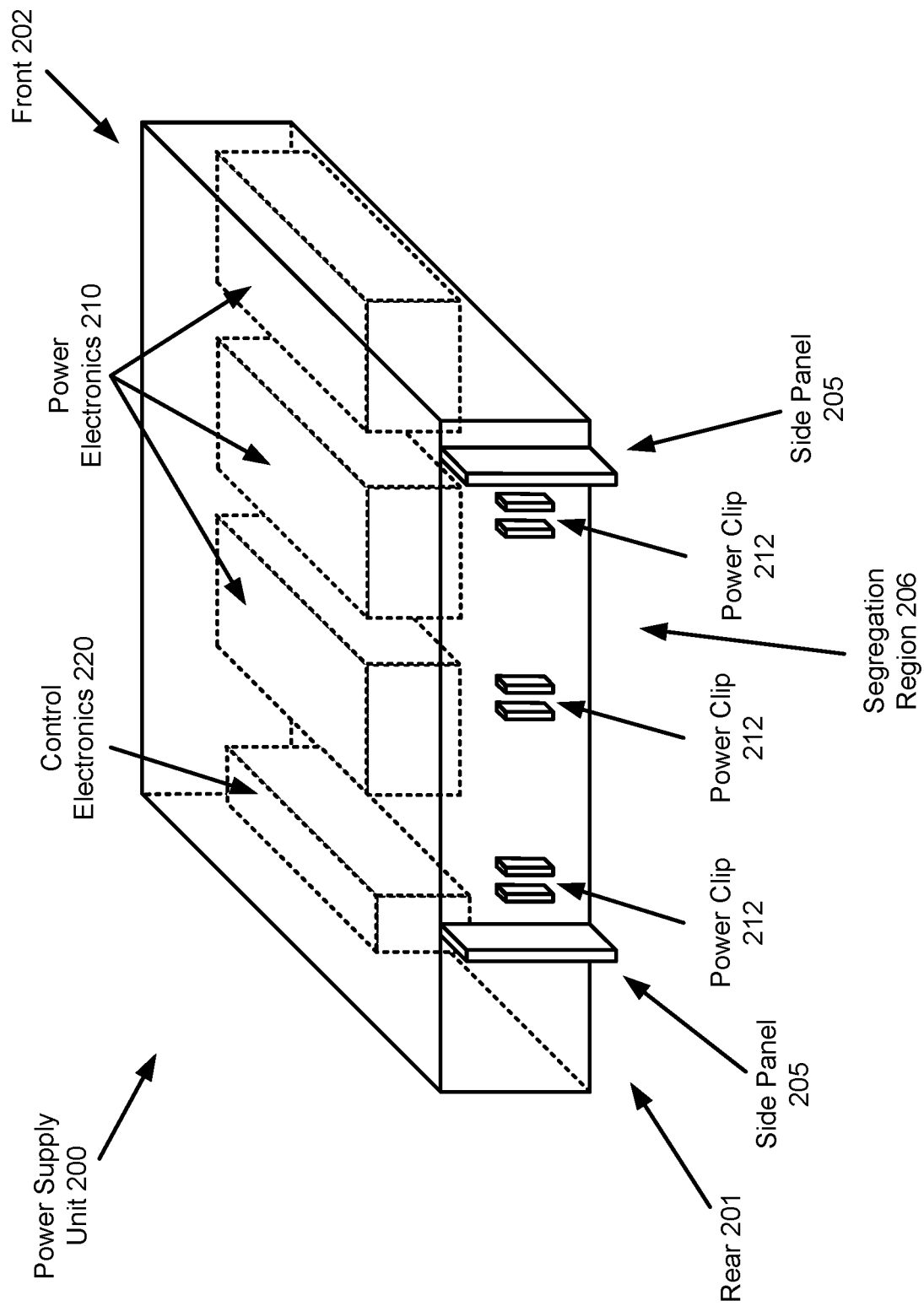
FIG. 2C shows a third diagram of a power supply unit according to one embodiment.

Turning to FIG. 2C, a diagram of example power supply unit 200 is shown with another configuration of side panels 205 in accordance with one or more embodiments is shown. In the configuration shown in FIG. 2C, two side panels 205 are shown that define a single segregation region 206. Multiple power clips may be positioned in the single segregation region. Use of a single segregation region may be implemented to reduce the number of components thereby allowing for easier installation and/or retrofitting of existing enclosures. However, doing so may inefficiently use of space of distribution are 125 if all of the space included in a segregation region is not needed for power clips 212 and other power distribution components.

Figure 2D:
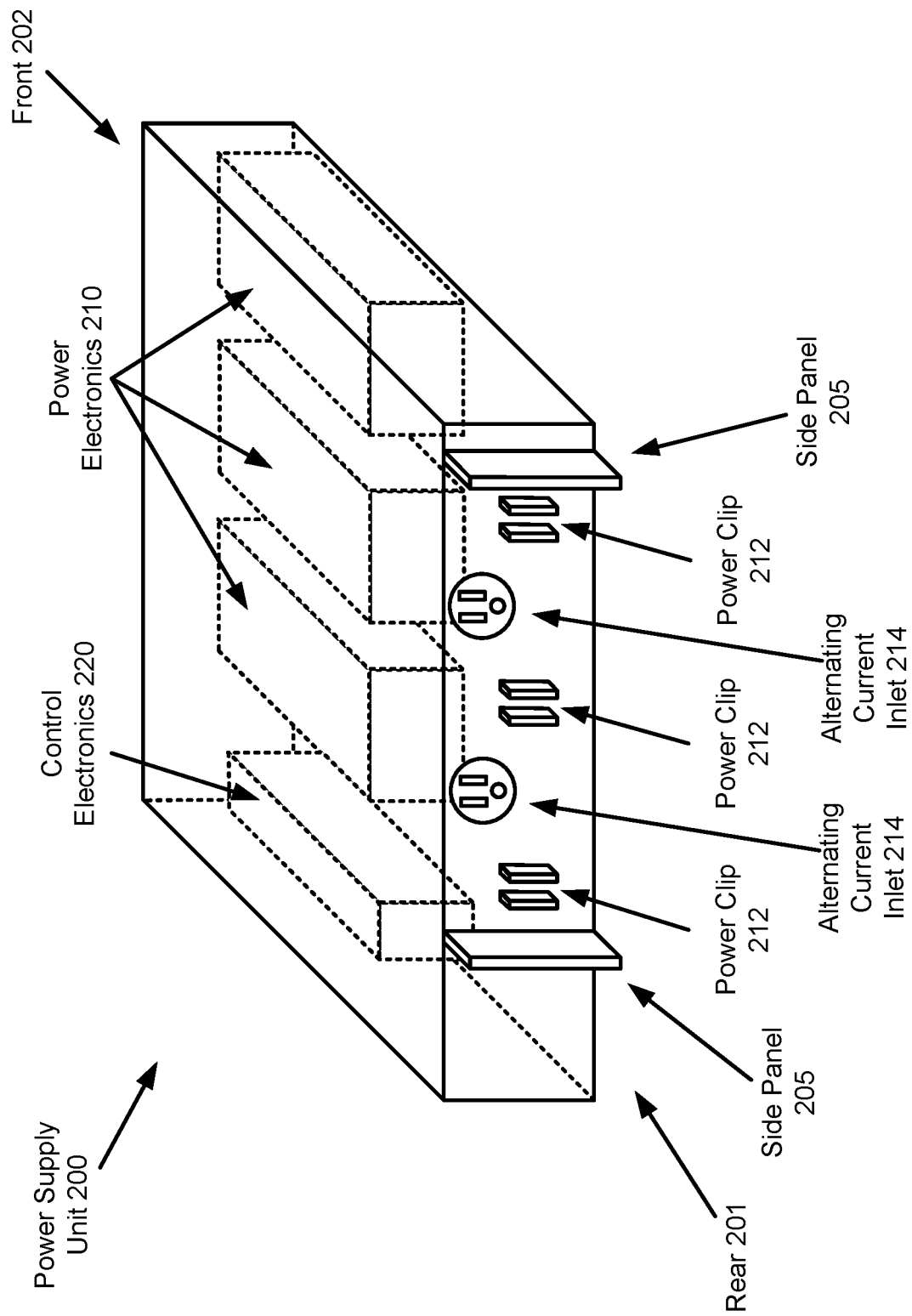
FIG. 2D shows a fourth diagram of a power supply unit according to one embodiment.

As discussed above, power supply unit 200 may receive power from other sources, condition the received power, and provide the conditioned power to other components. Turning to FIG. 2D, a diagram of example power supply unit 200 in accordance with one or more embodiments is shown. As seen in FIG. 2D, power supply unit 200 may include one or more alternating current inlets 214. The alternating current inlets 214 may allow for power from other sources to be provided to power electronics 210. For example, alternating current inlets 214 may be operably connected to a power source (e.g., a grid) with one or more cables that plug into (or otherwise attaches to) alternating current inlets 214.

In one embodiment, alternating current inlets 214 are positioned in segregation regions. For example, as seen in FIG. 2D, alternating current inlets 214 may be positioned with power clips in one or more segregation regions thereby reducing the likelihood of other components disrupting the functions of these components. As will be discussed in greater detail below, in at least one embodiment the components that may attach to the side panels may include a power cable and a power plug (attached to the power cable) that may attach to the alternating current inlets 214. The other end of the power cable may be or be capable of attachment to a power source. In this manner, all of the power distribution components may be segregated within a segregation region and may be easily connected to one another to facilitate power distribution.

In one embodiment, the alternating current inlets 214 are operably connected to the power electronics 210 for power transfer purposes thereby allowing alternating current to be provided to the power electronics 210. Power electronics 210 may also be operably connected to power clips 212 for power distribution purposes. These operable connections may be used with separate lines to allow for transfer of alternating current to power electronics 210 and transfer of direct current from power electronics 210 to other components through power clips 212.

In FIGS. 2A-2D, structures for facilitate power distribution have been described with respect to a power supply unit. However, these structures are equally usable with other types of components for use with an electronic rack. For example, server chassis, battery backup units, and/or other components that may be positioned in an electronic rack may also include similar side panels and power clips. For a particular electronic rack, these features of the server chassis, power supply units, battery backup units, and/or other components may be complementary to one another so that common busbars and other components may be usable to distribution power among these components. Similarly, the side panels of each of these components may be co-designed with one another to form walls (with other components in a distribution area) that substantially extend from a top to a bottom of a distribution area 125 thereby forming segregation regions that substantially extend from a top to a bottom of a distribution area (or substantial fraction thereof, and there may be some holes, opening, or other features that render the walls to be discontinuous).

Figure 3A:
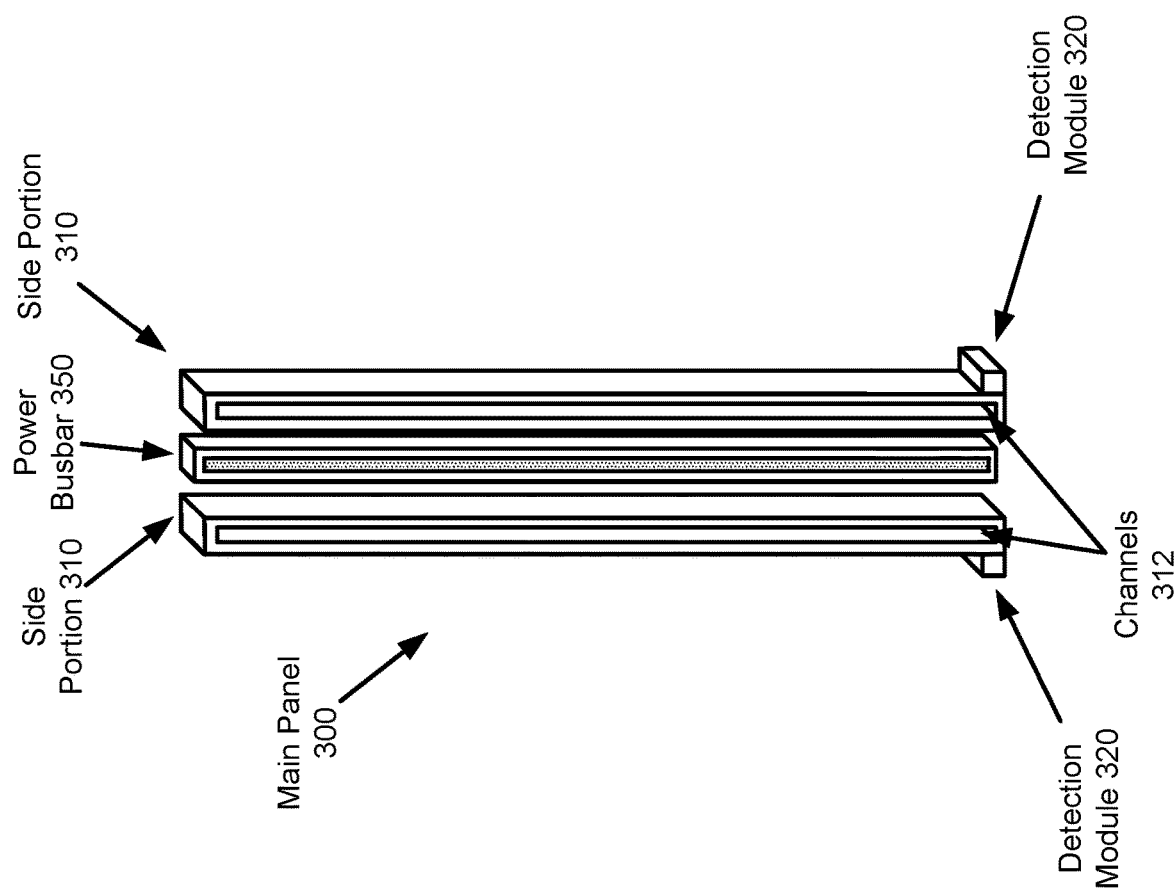
FIG. 3A shows a first diagram of a main panel according to one embodiment.

Turning to FIG. 3A, a first diagram of a main panel 300 in accordance with one or more embodiments is shown. Main panel 300 may facilitate (i) distribution of power from power supply unit 200 to other components such as server chassis, battery backup units, and/or other components in electronic rack 100 and (ii) segregation of components by forming walls (e.g., with side panels of server chassis, power supply units, battery backup units, etc.). For example, main panel 300 may be positioned in distribution area 125 of electronic rack 100 and may be adapted to connect to side panels or other structures to form segregation regions.

Main panel 300 may include side portions 310. Side portions 310 may be physical structures adapted to form segregation regions while power supply unit 200 is positioned in electronic rack 100. For example, side portions 310 may have shapes that are complimentary to that of a power supply unit and side panels positioned thereon to form segregation regions in which power distribution components are positioned. The side portions 310 may include channels 312 or other features for allowing insertion of portions of side panels. The channels 312 may include recesses from the surface of side portions 310 with shapes corresponding to the side panels.

While the side panels are inserted into the side portions 310, the side panels and side portions 310 may form walls that partially enclose segregation regions and components therein. By forming these walls, cooling fluid and other materials outside of the segregation regions may be less likely to interact with the components in the segregation regions. For example, the formed walls may prevent cooling fluid from entering the segregation regions which may otherwise short out or impede the operation of components in a segregation region. Pairs of side portions 310 may, with corresponding side panels, form the segregation regions.

The formed walls may, for example, extend from the rear of the power supply unit to a back panel of an electronic rack or another structure positioned in distribution area 125. These components may substantially surround a segregation region on three sides (while the enclosure of power supply units and other components in an electronic rack may surround the segregation region on a fourth side). For additional details regarding other structures positioned in distribution area 125, refer to the discussion of FIG. 3B, below.

The main panel 300 may include (or it may be a separate component) one or more power distribution components such as power busbar 350. Power busbar 350 may be a power distribution component capable of distributing direct current provided by power supply unit to other components such as server chassis and battery backup units (e.g., which each may also be operably connected to power busbar 350 when positioned in an electronic rack). Power busbar 350 may include any number of conductors positioned and oriented to form connections with power clips (e.g., of server chassis, power supply units, battery backup units, etc.) when power supply unit 200 is positioned in electronic rack 100. Power busbar 350 may also include a housing or other components to limit access to the conductors while facilitating connection of power clips to the conductors.

The power distribution components may be positioned between pairs of side portions 310 to be within segregation regions. While illustrated in FIG. 3A with respect to an example, a main panel 300 may include any number of side portions 310 and power components such as power busbar 350 to compliment side panels and power clips (e.g., as illustrated in FIGS. 2A-2D) of components positioned in an electronic rack.

In one embodiment, the main panel 300 includes one or more detection modules 320. The detection modules 320 may provide for the detection and reporting of the presence of cooling fluid or other materials. For example, detection modules 320 may include sensors or other structures usable to detect the presence of certain materials (e.g., cooling fluid). The sensors may be operably connected to a computing device (e.g., an embedded computing device, a general computing device, etc.)) that may report the detection of the certain materials to other devices, such as a rack manager (not shown) for electronic rack 100. If such a detection occurs, the rack manager may take action such as, for example, (i) notifying an administrator, (ii) suspending power distribution by power supply unit, (iii) suspending a flow of cooling fluid in fluid distribution components, etc. The rack manager may take other actions without departing from embodiments disclosed herein.

The detection module 320 and rack manager may be operably connected to each other through one or more wired or wireless networks (not shown) or connections (not shown). The operable connection may allow the detection module 320 to report detections of certain materials to the rack manager.

The detection modules 320 may be positioned with the side portions 310 to facilitate detection of the presence of certain materials on the side portions 310. For example, the detection modules 320 may be positioned with a lower portion of the side portions 310 such that gravity or other forces may direct the certain materials on the side portions 310 to the detection modules. While illustrated in FIG. 3A as distinct components, the detection modules 320 may be integrated with the side portions 310 or other components of main panel 300 without departing from embodiments disclosed herein. For example, multiple sensors may be embedded or otherwise positioned along the length, width, and/or height of side portions 310 thereby allowing for detection of certain materials anywhere (or only on some portions of) on side portions 310. In one embodiment, multiple detection modules 320 can be designed on the side portion 310 at different height from that illustrated in this figure.

In one embodiment, the components of main panel 300 are packaged as a kit that allows for the components to be installed in an existing electronic rack. The components may be installed by attaching them to structural components of the electronic rack. For example, to provide these components as a kit or otherwise group them with respect to one another, the components may be attached to one another with another panel.

Figure 3B:
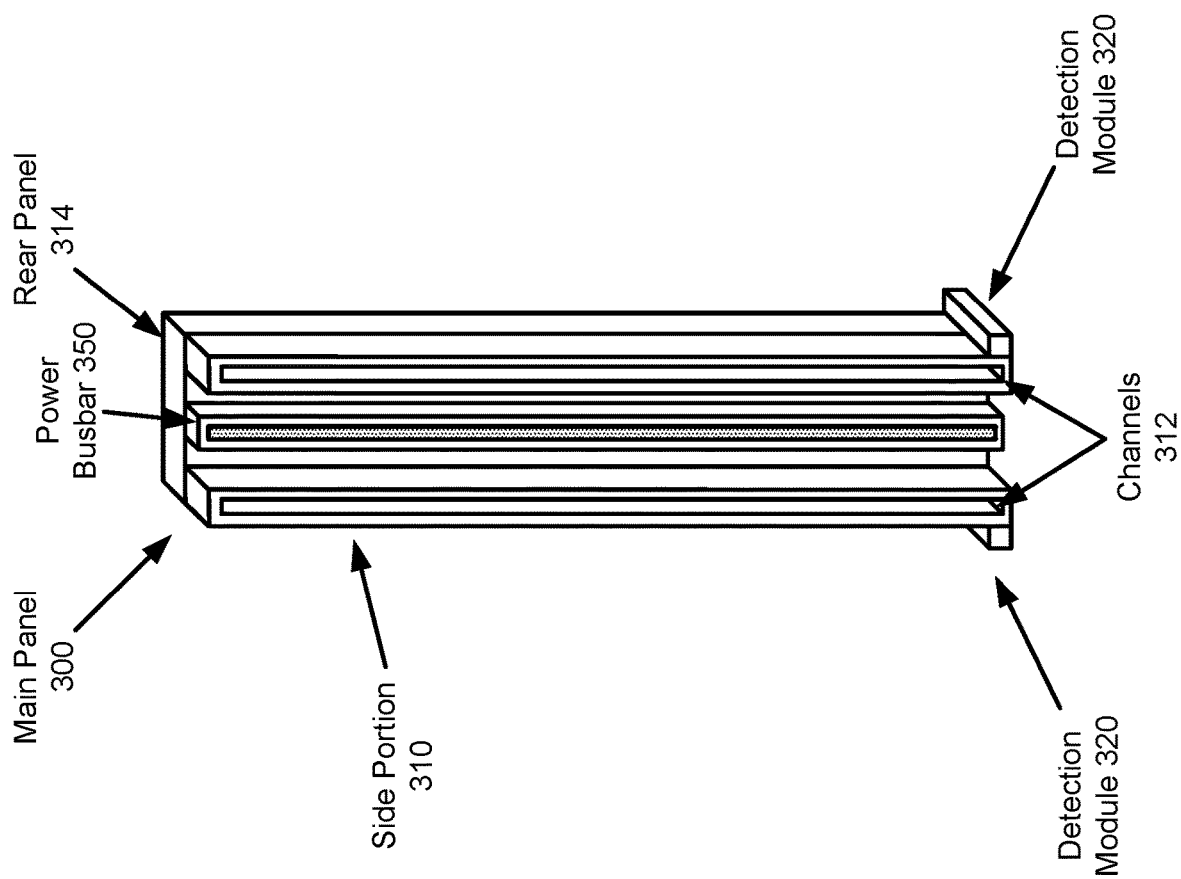
FIG. 3B shows a second diagram of a main panel according to one embodiment.

Turning to FIG. 3B, a second diagram of a main panel 300 in accordance with one or more embodiments is shown. In FIG. 3B, a rear panel 314 is integrated with the side portions 310, power busbar 350, and detection modules 320. This integration may modularize the main panel 300 thereby allowing for efficient installation and/or retrofitting of existing electronic racks. For example, the side portions 310, detection modules, and/or power busbar may generally be affixed to rear panel 314 thereby allowing from a single module to be moved, positioned, and/or otherwise utilized. In some embodiments, the rear panel 314 is formed with a solid piece of material. In other embodiments, all or a portion of the rear panel 314 is formed with a perforated material (or other material to facilitate the flow of gasses).

To further clarify the interactions between electronic rack 100, power supply unit 200, and main panel 300, a number of figures (e.g., 4A-4H) are discussed below that each illustrate relationships between these components such as how these components may be connected to one another.

While a limited number of components are illustrated in each of these figures, it will be appreciated that additional components may be present such as multiple power supply units, multiple server chassis, and/or other components without departing from embodiments disclosed herein.

Turning to FIG. 4A, a first side view diagram of an electronic racks 100 in accordance with one or more embodiments is shown. In FIG. 4A, components that may be obscured from view by side portions and side panels are illustrated with dashed lines. To facilitate understanding, the dimensions of some of the components have been adjusted from those that may be implemented in practice. Accordingly, these components may have different dimensions without departing from embodiments disclosed herein.

As seen in FIG. 4A, a main panel 300 may be positioned in a rear of the electronic rack 100. When so positioned, power clips 212 of power supply unit 200 may be attached to power busbar 350 when power supply unit 200 is fully positioned in electronic rack 100. In FIG. 4A, power supply unit 200 is illustrated as being partially positioned in electronic rack 100 (e.g., such as when power supply unit 200 is moved into electronic rack 100 through the front end 134 of the electronic rack during a front side installation).

Figure 4B:
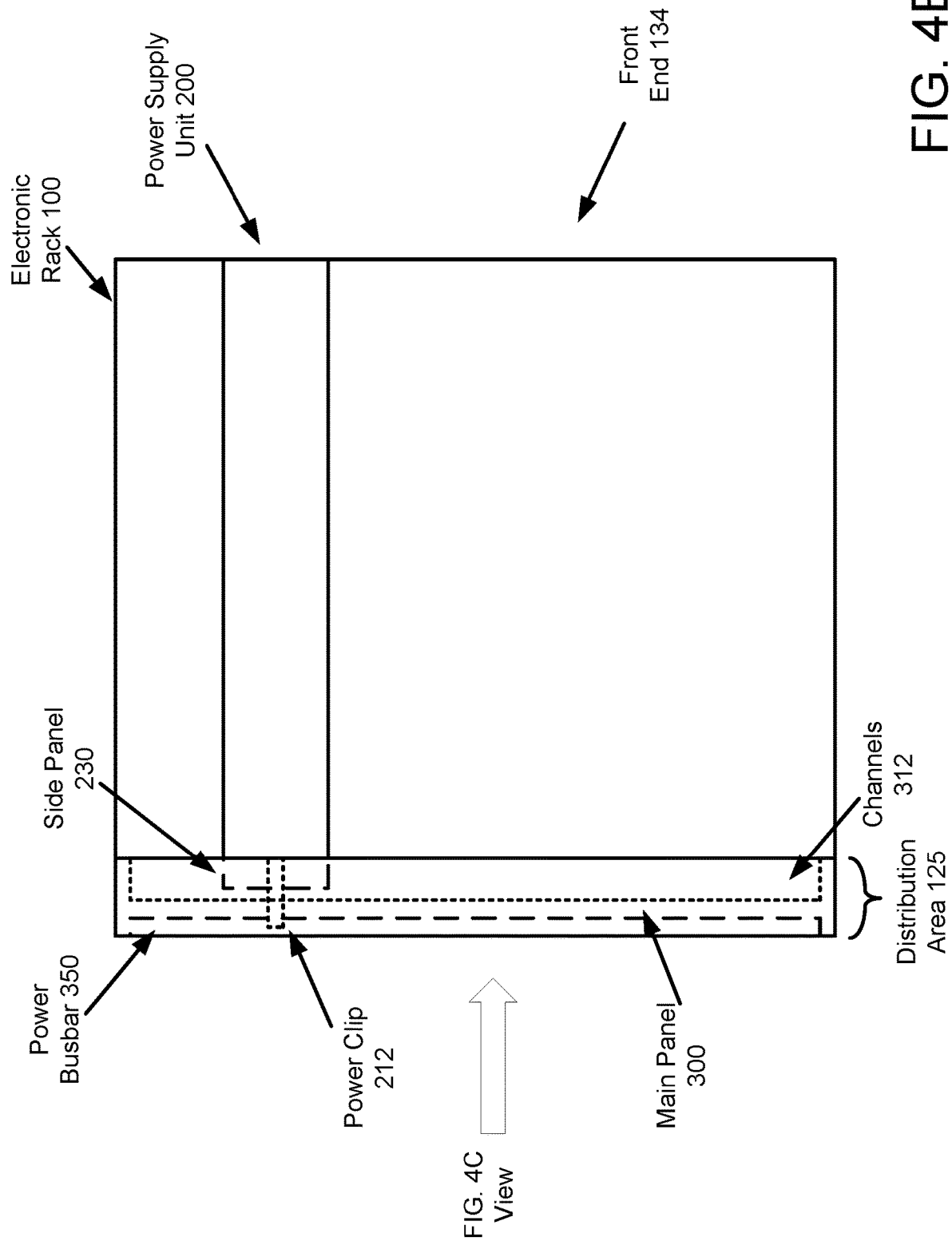
FIG. 4B shows a second side view diagram of an electronic rack and power supply unit according to one embodiment.

Turning to FIG. 4B, a second side view diagram of an electronic racks 100 in accordance with one or more embodiments is shown. In FIG. 4B, power supply unit 200 may be positioned entirely in electronic rack 100. As seen in FIG. 4B, when positioned entirely in the rack, the power clip 212 may contact power busbar 350 thereby allowing power supply unit 200 to provide power to other components attached to power busbar 350. For example, while not illustrated, server chassis may be positioned above and/or below power supply unit 200 which may draw current from power busbar 350 while positioned in electronic rack 100.

Additionally, when fully positioned in the electronic rack, the side panels 230 may be partially (or totally) inserted into channels 312 inside portions of main panel 300. This insertion may form a segregation region in which power clip 212 and power busbar 350 are positioned. It is shown that the combination of the side panel and the main panel may provide a full segregation of the power clip and the busbar. In FIG. 4B, this segregation region may extend into the page with other depths into the page being outside of the segregation region (and in which other types of components such as cooling fluid distribution components may be positioned). Similarly, other components such as server chassis (not shown) may also include side panels that similarly form walls delineating segregation regions in distribution area 125 from other areas. In this manner, the formed segregation regions may substantially extend from the top to the bottom of the distribution area 125 as illustrated in FIG. 4B.

Figure 4C:
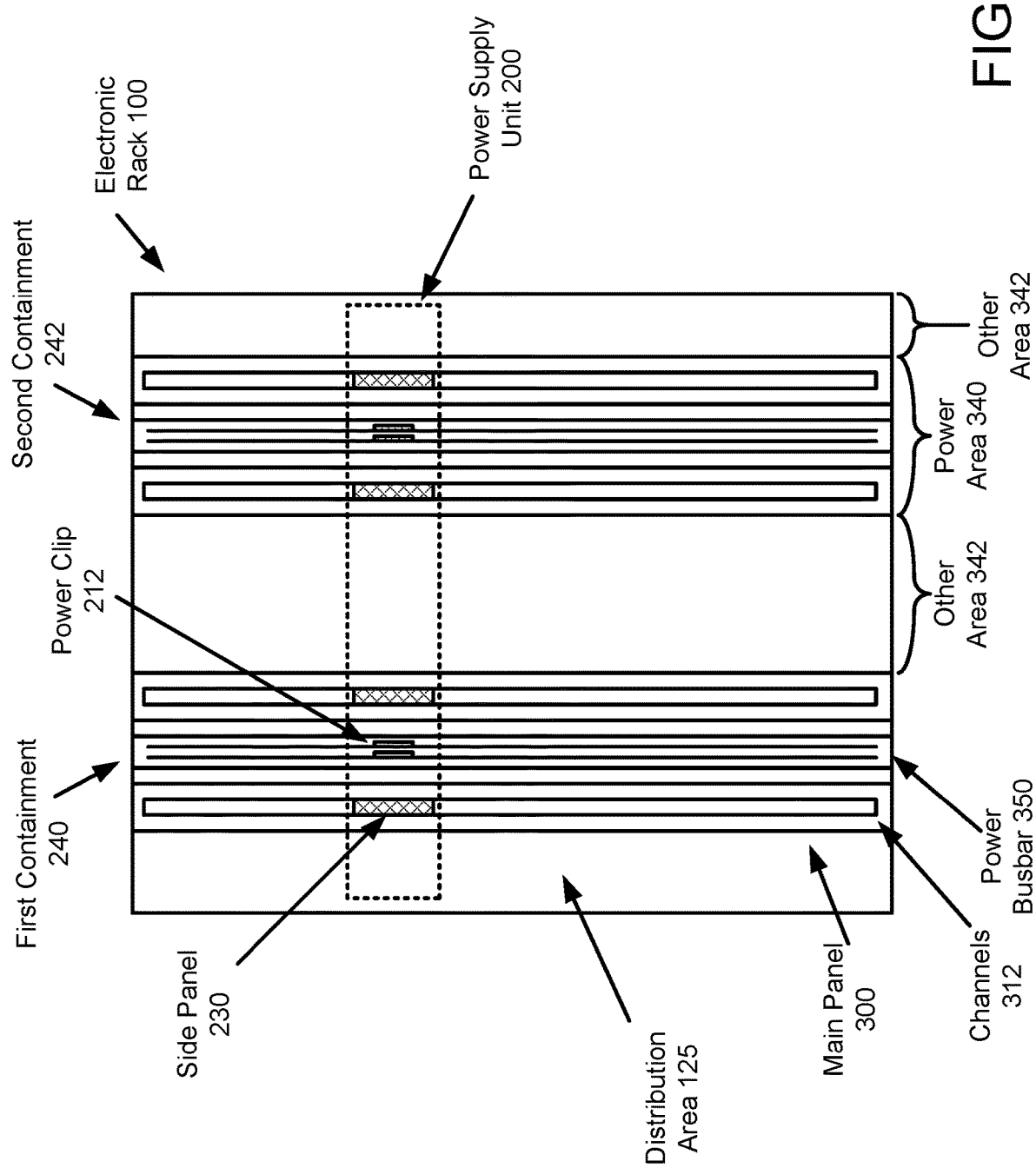
FIG. 4C shows a rear view diagram of an electronic rack and power supply unit according to one embodiment.

Turning to FIG. 4C, rear view diagram of an electronic racks 100 (e.g., similar to that illustrated in FIG. 4B) in accordance with one or more embodiments is shown. In FIG. 4C, a rear panel and other components that may be present in an electronic rack are not shown and only an outline of the enclosure 203 is drawn. The power clips 212 and side panels 230 are drawn with dotted fill and hatched fill, respectively.

As seen in FIG. 4C, one or more main panels 300 may be positioned along the rear panel in the distribution area 125. These main panels 300 may be positioned and co-designed with power supply unit 200 to allow power clips 212 and side panels 230 to interface with power busbar 350 and channels 312, respectively. Interfacing of these components may form segregation regions that act as a first containment 240 and second containment 242 for the power clips 212.

The side panels 230 and side portions 310 may form walls that surround the power clips 212 on two sides (left and right of each power clip in this figure). These containments 240, 242, may be used as power areas 340 for distribution of power in distribution area 125. Other areas 342 outside of these power areas 340 may be usable for other purposes such as cooling fluid distribution.

In this figure, the power supply unit 200 is illustrated as distributing power with two power busbars 350. However, power supply unit 200 may distribute power with different numbers of power busbars. Additionally, while not illustrated, other power supply units may also be connected to these power busbars thereby providing redundancy and/or to divide the load across multiple power supply units.

Additionally, while the channels 312 in FIG. 4C are illustrated as generally extending from top to bottom of electronic rack 100 in a continuous manner, the channels 312 may be discontinuous. For example, recessed areas in the side portions for receiving portions of the side panels may only be included corresponding to where the side panels will (or generally will with some factor to provide a level of accommodation for manufacturing tolerance, movement needs, etc.) interface with the side portions.

Further, while not illustrated, any number of cooling fluid distribution components (e.g., fluid lines, manifolds, etc.) may be implemented in the other areas 342. For example, the cooling fluid distribution components may be positioned to the left of the power areas 340, at area 342, between the power areas 340 and 350, or being positioned to the right of the power areas 340 (depending on the design of the components such as server chassis that may utilize cooling fluid).

To form the segregation regions, main panels 300 may be positioned in distribution area 125. In some embodiments, the main panels 300 are positioned in the distribution area 125 prior to positioning of power supply units, server chassis, battery backup units, and/or other components in electronic rack 100. In other embodiments, the main panels 300 are positioned in the distribution area 125 after positioning of power supply units, server chassis, battery backup units, and/or other components in electronic rack 100.

Figure 4D:
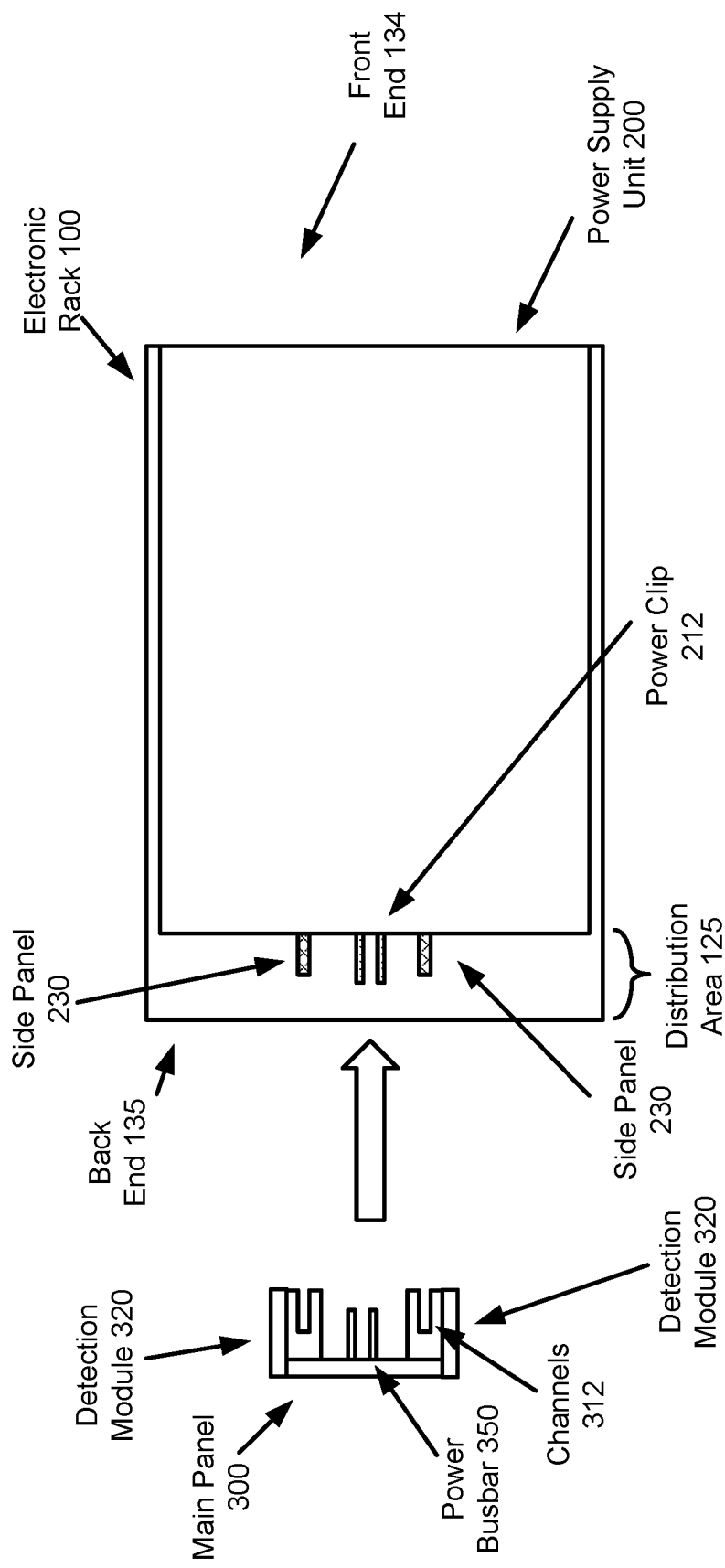
FIG. 4D shows a first top view diagram of an electronic rack, power supply unit, and main panel according to one embodiment.

Turning to FIG. 4D, a top view diagram of electronic rack 100 in accordance with one or more embodiments is shown. As seen in FIG. 4D, power supply unit 200 is positioned in electronic rack 100 prior to positioning of any main panels in distribution area 125 of electronic rack. In such a scenario, as seen in FIG. 4D, to position a main panel 300, the main panel 300 may be moved into distribution area 125 through a back end 135 of electronic rack 100. While illustrated in FIG. 4D with respect to a single main panel, multiple main panels may be moved into electronic rack 100 through this process without departing from embodiments disclosed herein.

To do so, in an embodiment, the power busbar 350 may first be attached to power clip 212 of power supply unit 200 (and/or other power clips of other components stacked above/below power supply unit 200). For example, the power busbar 350 may be physically separable from the other components of the main panel 300 to allow for its separate installation. Once the power busbar 350 is attached to the power clips 212, then the main panel including the channels 312 and detection modules 320 may be moved into the distribution area 125 through the back end 135. When doing so, the side panels 230 may be partially inserted into the channels 312.

In other embodiments, the power busbar 350 along with the other portions of the main panel 300 may be moved together as a single unit into distribution area 125. In such a movement, the power clip 212 may be connected to power busbar 350 and the side panels 230 may insert into the channels 312. In other embodiment, the power busbar 350 along with the other components of the main panel 300 moved together and the channel 312 being able to be pushed along the main panel and side panel being inserted into the channels.

Figure 4E:
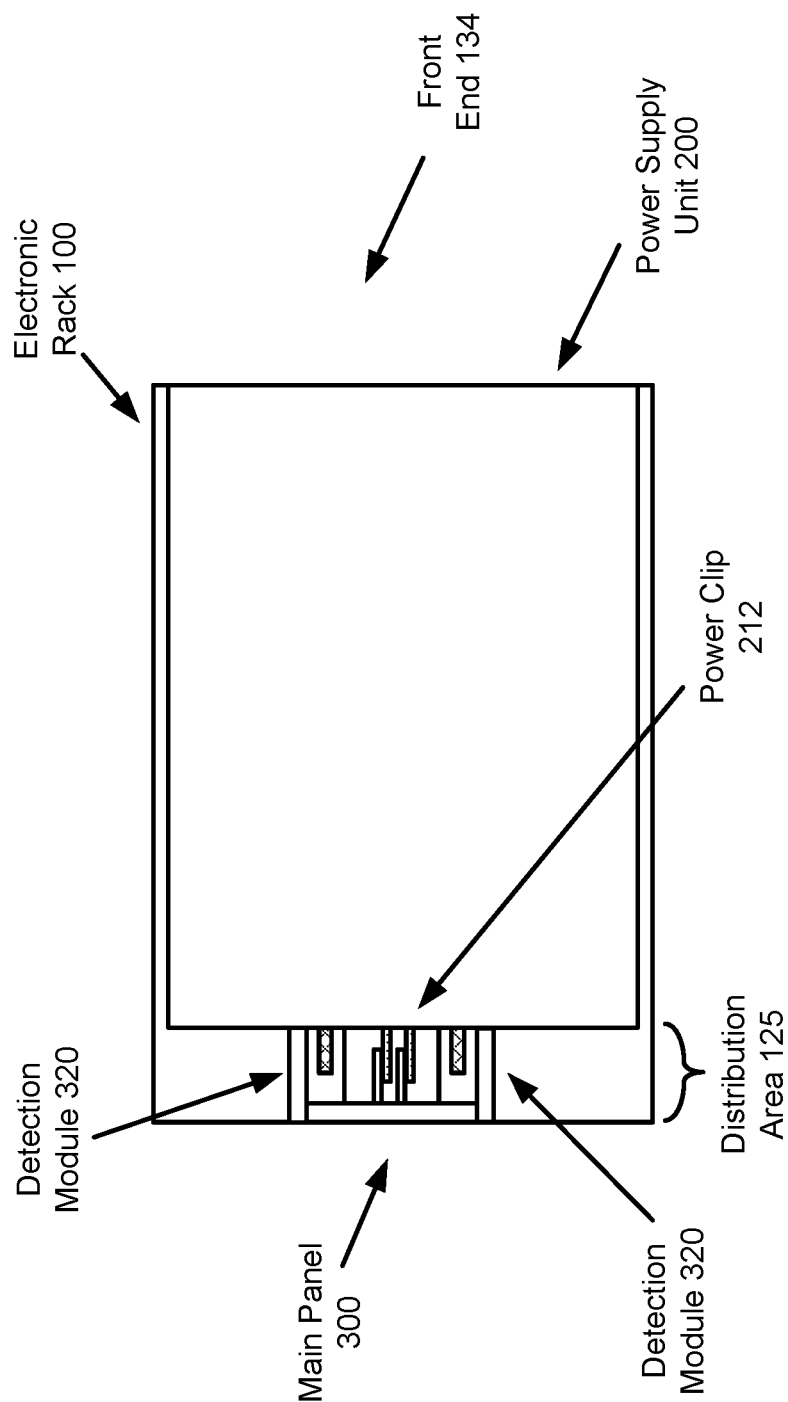
FIG. 4E shows a second top view diagram of an electronic rack, power supply unit, and main panel according to one embodiment.

Turning to FIG. 4E, a top view diagram of electronic rack 100 in accordance with one or more embodiments is shown. FIG. 4E illustrates an example after installation of a main panel 300 in an electronic rack 100. As seen in FIG. 4E, the power clip 212 and power busbar are segregated from other components in distribution area 125. The detection modules 320 are also positioned appropriately to detect when certain materials from outside the segregation region contact the side panels and/or side portions.

Figure 4F:
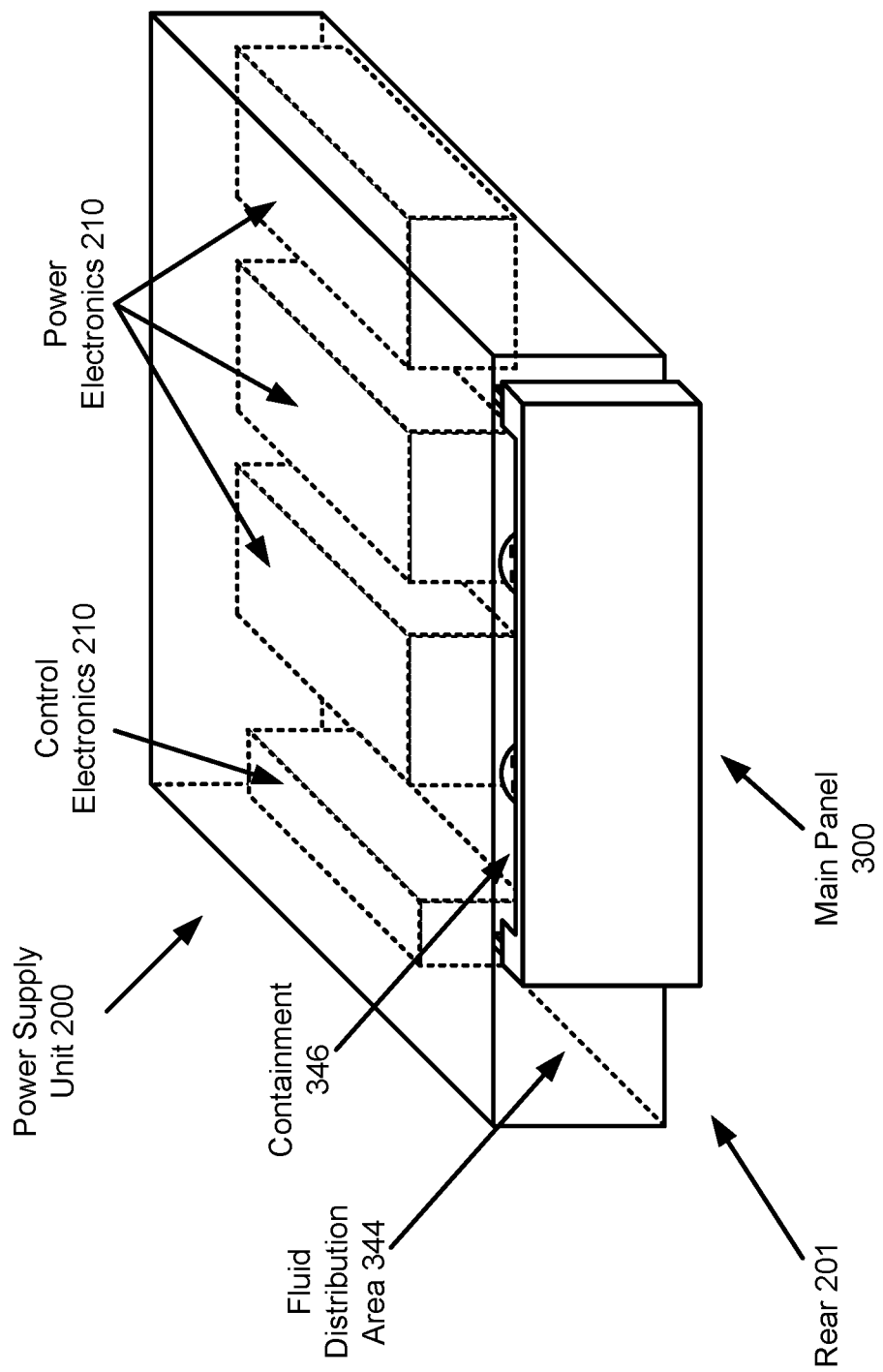
FIG. 4F shows a diagram of a power supply unit and a main panel according to one embodiment.

Turning to FIG. 4F, a diagram of a main panel (or a portion thereof) installed with a power supply unit 200 is illustrated. In FIG. 4F, the main panel 300 has been installed with the power supply unit configuration shown in FIG. 2D. As seen in FIG. 4F, when the main panel 300 is installed, a containment 346 is formed. The containment 346 segregates power clips and alternating current inlets from other areas. For example, the containment 346 may segregate these components from a fluid distribution area 344 in which cooling fluid distribution components may be positioned. The rear side of the panel may be partially open in one embodiment.

Figure 4G:
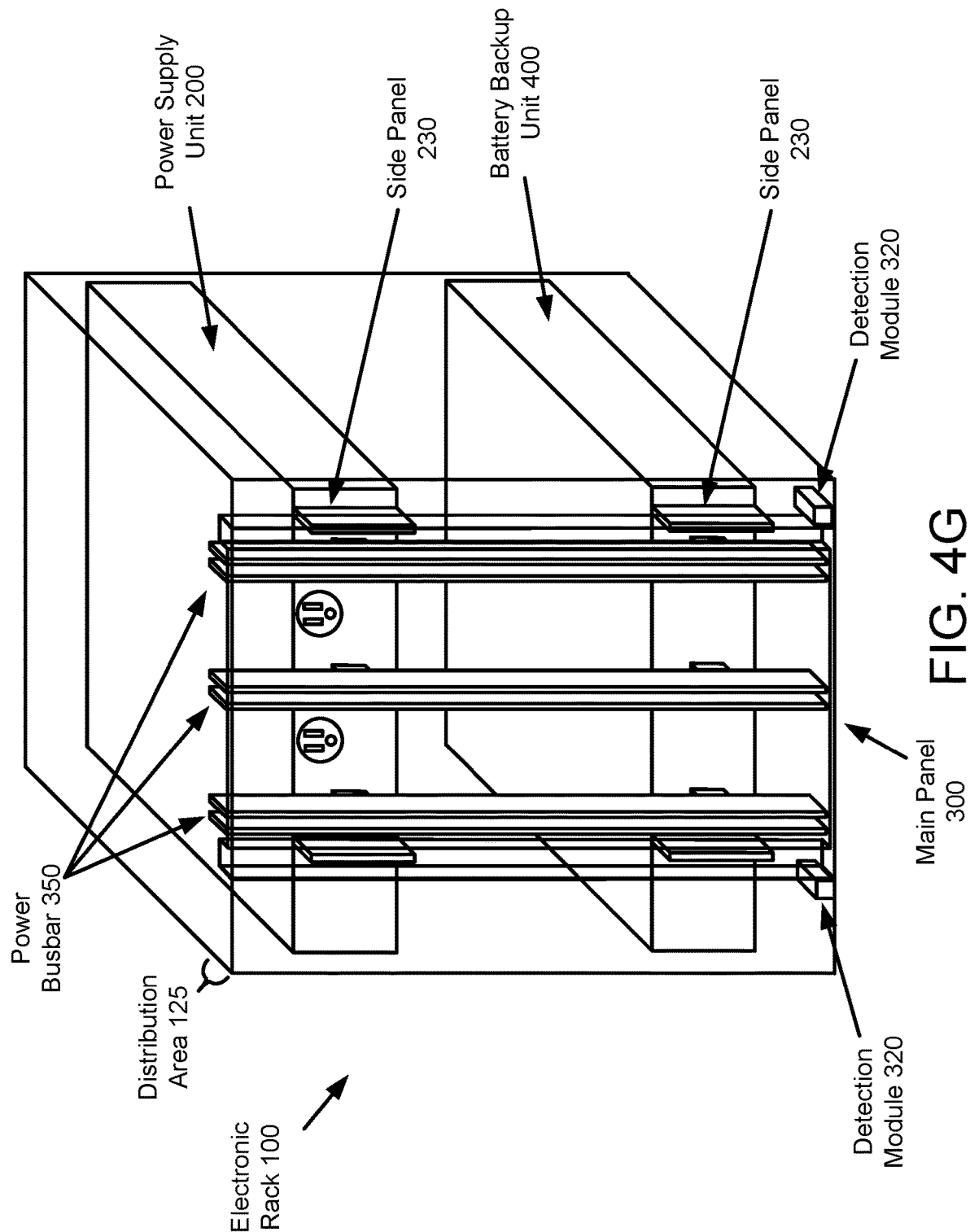
FIG. 4G shows a diagram of an electronic rack, power supply unit, and main panel according to one embodiment.

Turning to FIG. 4G, a diagram of a main panel 300 installed in an electronic rack 100 in accordance with one or more embodiments is shown. In this figure, only the outline of main panel 300 and electronic rack 100 is drawn so that other components (i.e., power supply unit 200, battery backup unit 400) positioned behind main panel 300 and within electronic rack 100 may be seen.

As seen in the figure, each of power supply unit 200 and battery backup unit 400 may be co-designed with each other to have similar power clip and side panel placements. For example, both of these components include a single pair of side panels 230 with multiple power slips positioned between the single pair of side panels 230. By virtue of this co-design, a single main panel 300 is able to segregate these components from other components that may be present in distribution area 125. For example, the power clips and side panels may be stacked on top of one another thereby allowing each to be inserted into a same power busbar 350 or channel of main panel 300.

Additionally, as seen in FIG. 4G, installation of main panel 300 may position detection modules 320 in distribution area 125. In this manner, certain materials in distribution area 125 that may disrupt the function of power busbar 350 and/or power clips 212 may be detected.

Figure 4H:
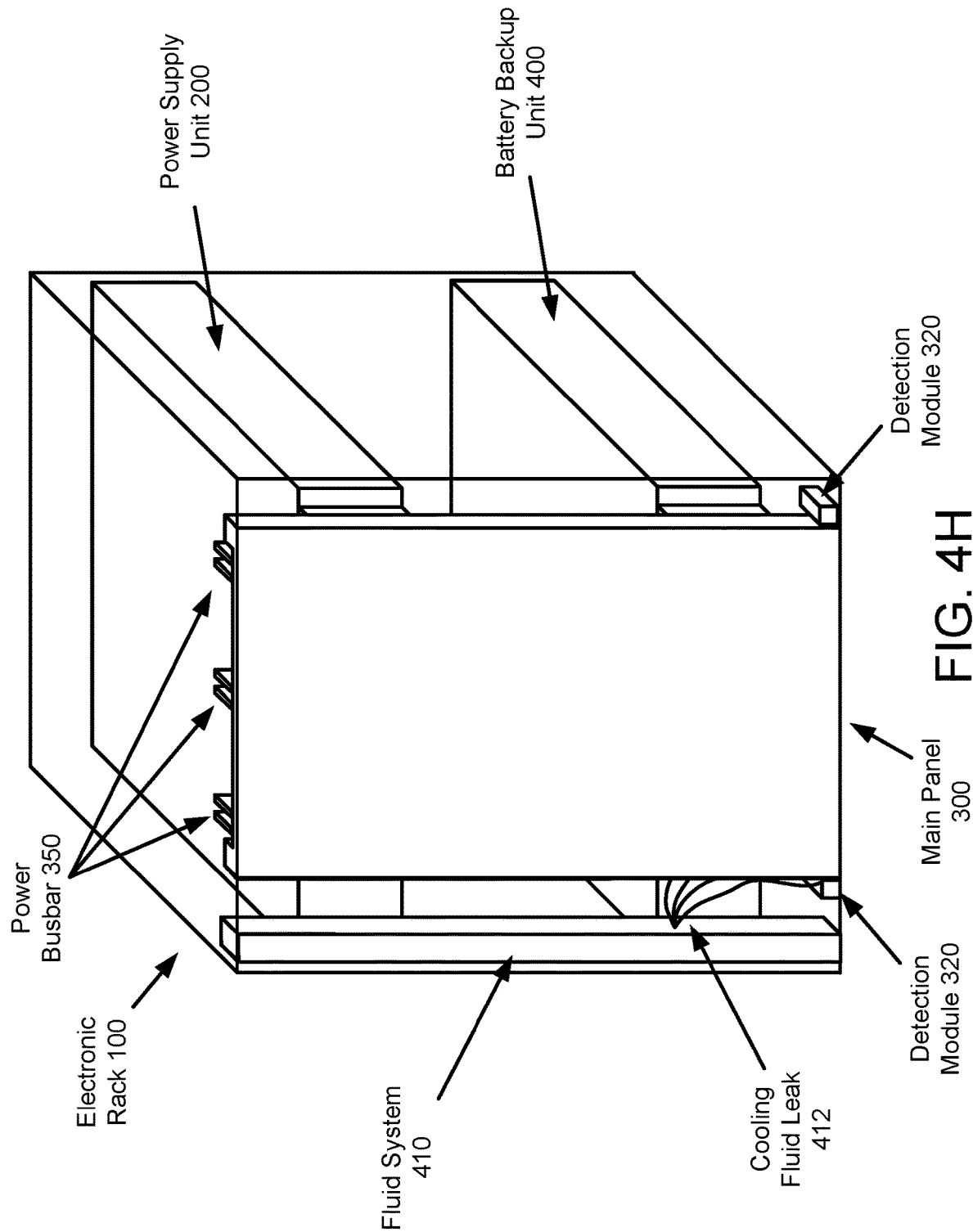
FIG. 4H shows a diagram of an electronic rack, power supply unit, main panel, and fluid system according to one embodiment.

Turning to FIG. 4H, a diagram of a main panel 300 installed in an electronic rack 100 in accordance with one or more embodiments is shown. This figure may be generally similar to that shown in FIG. 4G. However, a fluid system 410 is also shown as being installed in the distribution area 125. Fluid system 410 may provide for distribution of cooling fluid to server chassis and other components in electronic rack 100 for cooling purposes.

However, the presence of fluid system 410 may present a risk to power busbars 350 and other components. For example, should cooling fluid leak from fluid system 410, it may disrupt the operation of these components should it come into contact with them.

Consider a scenario in which main panel 300 is present in electronic rack 100 when a cooling fluid leak 412 from fluid system 410 occurs. In this scenario, cooling fluid begins to spray out of the leak and towards the power busbars 350. However, by virtue of the walls formed with main panel 300, the cooling fluid is prevented from entering the segregation area in which the power busbars 350 are positioned. For example, in FIG. 4H, the cooling fluid is illustrated with lines emanating from fluid system 410, impacting main panel 300, and flowing down the side of main panel 300 to detection module 320. When the cooling fluid reaches detection module 320, the detection module 320 identifies the presence of the cooling fluid and notifies a rack manager (not shown) of the presence of this cooling liquid. In response, the rack manager may take action to address the presence of the cooling liquid.

While illustrated in FIG. 4H with respect to a specific example fluid system 410 positioning, other positioning is possible without departing from embodiments disclosed herein. For example, multiple fluid systems may be positioned on different side of main panel 300. If multiple main panels are installed, one or more of the fluid systems 410 may be positioned between the main panels.

Additionally, while not illustrated in FIG. 4H, a cord and plug for supplying power to the power supply unit 200 may be integrated with the main panel 300. For example, the cord may run with the power busbar (or may otherwise be positioned such that it will be within a segregation region when the main panel 300 is installed).

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
 a power supply unit positioned in the electronic rack, the power supply unit comprising a first power clip positioned on a rear of the power supply unit to distribute direct current to a server chassis positioned in the electronic rack;
 side panels positioned on the rear of the power supply unit next to the first power clip on two of its sides;
 a main panel positioned with respect to the side panels to form a first containment in which the first power clip is positioned while the power supply unit is positioned in the electronic rack, the first containment segregates the first power clip from a fluid system that is positioned within the electronic rack but exterior to the first containment, and the main panel comprising channels positioned to receive the side panels while the power supply unit is positioned in the electronic rack; and
 a power busbar positioned with the first power clip to distribute the direct current to the server chassis.

2. The electronic rack of claim 1, further comprising a detection module positioned with the main panel to detect a cooling fluid from the fluid system.

3. The electronic rack of claim 1, wherein the main panel further comprises:
 side portions on which the channels are positioned; and
 a rear portion connecting the side portions.

4. The electronic rack of claim 3, wherein each of the side panels are adapted to be inserted into the channels, the side panels and two side portions forming a continuous panel extending from the rear of the power supply unit to a back wall of the electronic rack while the power supply unit is positioned in the electronic rack.

5. The electronic rack of claim 4, wherein the rear portion comprises perforations, wherein the side portions comprise solid portions to form the continuous panel.

6. The electronic rack of claim 1, wherein the power supply unit further comprises a second power clip, wherein the main panel forms a second containment while the power supply unit is positioned in the electronic rack, the second containment segregates the second power clip from the fluid system positioned in the electronic rack and the first power clip.

7. The electronic rack of claim 1, wherein the power supply unit further comprises a second power clip, wherein the first containment segregates the second power clip from the fluid system positioned in the electronic rack.

8. The electronic rack of claim 1, further comprising:
 a battery backup unit comprising a third power clip positioned to connect to the power busbar while the battery backup unit is positioned in the electronic rack,
 wherein a portion of the side panels are positioned on a rear of the battery backup unit next to the third power clip on two of its sides,
 wherein a portion of the channels are positioned to receive the portion of the side panels while the battery backup unit is positioned in the electronic rack.

9. The electronic rack of claim 8, wherein the first containment segregates the third power clip from the fluid system positioned in the electronic rack.

10. The electronic rack of claim 1, wherein a portion of the side panels are positioned on a rear of the server chassis next to a third power clip on the server chassis while the server chassis is positioned in the electronic rack.

11. The electronic rack of claim 1, wherein main panel is adapted to be populated in the electronic rack after the power supply unit is populated in the electronic rack.

12. The electronic rack of claim 1, wherein main panel is adapted to be populated in the electronic rack before the power supply unit is populated in the electronic rack.

13. The electronic rack of claim 1, wherein the main panel further comprises a power cable and a connector for distributing alternating current to an alternating current inlet of the power supply unit.

14. A data center system, comprising:
 electronic racks, each of the electronic racks comprising:
  server chassis, each of the server chassis comprising:
   a first power clip for receiving direct current;
   one or more information technology (IT) components that operate using the direct current; and
   one or more cooling modules thermally coupled to the one or more IT components;
  a fluid system for distributing cooling fluid to the one or more cooling modules;
  a power supply unit comprising a second power clip positioned on a rear of the power supply unit to distribute the direct current to the server chassis;
  side panels positioned on the rear of the power supply unit next to the second power clip on two of its sides;
  a main panel positioned with respect to the side panels to form a first containment in which the second power clip is positioned, the first containment segregates the second power clip from the fluid system, and the main panel comprising channels positioned to receive the side panels; and a power busbar positioned with the first power clip and the second power clip to distribute the direct current to the server chassis.

15. The data center of claim 14, wherein the main panel comprises a power cable and a connector for distributing alternating current to the power supply unit.

16. The data center system of claim 14, wherein each electronic rack further comprises a detection module positioned with the main panel to detect a cooling fluid from the fluid system.

17. The data center system of claim 14, wherein the main panel further comprises:
   side portions on which the channels are positioned; and
   a rear portion connecting the side portions.

18. The data center system of claim 15, wherein each of the side panels are adapted to be partially inserted into the channels, the side panels and two side portions forming a continuous panel extending from the rear of the power supply unit to a back wall of the electronic rack while the power supply unit is positioned in the electronic rack.

19. The data center system of claim 14, wherein each electronic rack further comprises:
   a battery backup unit comprising a third power clip positioned to connect to the power busbar while the battery backup unit is positioned in the electronic rack,
   wherein a portion of the side panels are positioned on a rear of the battery backup unit next to the third power clip on two of its sides,
   wherein a portion of the channels are positioned to receive the portion of the side panels while the battery backup unit is positioned in the electronic rack.

20. The data center system of claim 19, wherein the first containment segregates the third power clip from the fluid system positioned in the electronic rack.

\* \* \* \* \*